(12) United States Patent
Hori

(10) Patent No.: US 7,042,254 B2
(45) Date of Patent: May 9, 2006

(54) DIFFERENTIAL SIGNAL RECEIVING DEVICE AND DIFFERENTIAL SIGNAL TRANSMISSION SYSTEM

(75) Inventor: Yoshihiko Hori, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 25 days.

(21) Appl. No.: 10/846,674

(22) Filed: May 17, 2004

(65) Prior Publication Data

US 2004/0239374 A1 Dec. 2, 2004

(30) Foreign Application Priority Data

May 27, 2003 (JP) .............................. 2003-149107

(51) Int. Cl.
*H03K 5/22* (2006.01)

(52) U.S. Cl. ........................................ 327/65; 327/108
(58) Field of Classification Search .................. 327/65, 327/563

See application file for complete search history.

(56) References Cited

U.S. PATENT DOCUMENTS 6,346,832 B1 * 2/2002 Young ........................ 327/108
2003/0201802 A1 * 10/2003 Young ........................ 327/108

FOREIGN PATENT DOCUMENTS

JP 2002-204272 7/2002

* cited by examiner

*Primary Examiner*—Long Nguyen
(74) *Attorney, Agent, or Firm*—McGinn IP Law Group, PLLC

(57) ABSTRACT

The intermediate node of a first terminator is connected between a first pair of signal lines transmitting a first differential signal, with one side of a third differential signal as a common voltage. The intermediate node of a second terminator is connected between a second pair of signal lines transmitting a second differential signal, with the other side of the third differential signal as a common voltage. The two intermediate nodes are connected by an intermediate connection. The intermediate node of the first terminator and the intermediate node of the second terminator act as a virtual ground of the third differential signal, enabling matching of the impedance of the terminators related to the third differential signal and the impedance of the signal lines related to the third differential signal. It is thus possible to prevent the reflection of the third differential signal.

12 Claims, 7 Drawing Sheets

DIFFERENTIAL SIGNAL RECEIVING DEVICE AND DIFFERENTIAL SIGNAL TRANSMISSION SYSTEM

BACKGROUND OF THE INVENTION

1. Field of the Invention

The present invention relates to a differential signal receiving device and a differential signal transmission system and, more particularly, to a differential signal receiving device and a differential signal transmission system using a plurality of differential signals.

2. Description of the Related Art

Signal transmission devices that transmit a differential signal through a pair of transmission lines have been used. The transmission of a differential signal through a transmission line pair is effective in reducing noise since it can cancel out the noise with substantially the same amplitude and phase occurring equally on the transmission line pair and suppress electromagnetic interference (EMI: a generic term for electromagnetic disturbance and interruption to an external device).

Japanese Unexamined Patent Application Publication No. 2002-204272 describes and illustrates in FIG. 2 a signal transmission system that superposes a different signal on each of first and second differential signals and transmits the first and second differential signals superposed with different signals through two pairs of transmission lines.

Specifically, a positive phase single-ended signal is input to an intermediate node of resistors placed between the transmission line pair for transmitting the first differential signal, and a reverse phase single-ended signal is input to an intermediate node of resistors placed between the transmission line pair for transmitting the second differential signal. This allows the transmission of two differential signals and one single-ended signal with four transmission lines.

To receive the first differential signal, a differential signal receiving circuit detects a voltage at a terminator placed between the transmission line pair for transmitting the first differential signal. To receive the second differential signal, the differential signal receiving circuit detects a voltage at a terminator placed between the transmission line pair for transmitting the second differential signal.

The positive phase single-ended signal is detected at an intermediate node of the terminator placed between the transmission line pair for transmitting the first differential signal. The reverse phase single-ended signal is detected at an intermediate node of the terminator placed between the transmission line pair for transmitting the second differential signal.

The conventional signal transmission system may transmit a third differential signal instead of the positive phase single-ended signal and the reverse phase single-ended signal. This allows the transmission of three differential signals with four transmission lines.

However, when the conventional signal transmission system transmits the third differential signal instead of the positive phase and reverse phase single-ended signals, the third differential signal is undesirably reflected when it reaches the end of the signal line.

This is because the ends of the signal lines transmitting the third differential signal, which are between the terminator placed between the transmission line pair transmitting the first differential signal and the terminator placed between the transmission line pair transmitting the second differential signal, are open (high impedance) and the impedances of the terminators and the signal lines for the third differential signal do not match.

Further, in the case of transmitting the three differential signals with the four signal lines, an input buffer at the receiving side should extract and amplify the third differential signal in addition to receive the first and second differential signals. It is thus preferred that the input buffer effectively extracts the third differential signal and has an efficient circuit configuration.

SUMMARY OF THE INVENTION

In view of the foregoing, it is an object of the present invention to prevent the reflection of a differential signal at the end of a signal line when transmitting three differential signals with two pairs of signal lines. It is another object of the present invention to effectively extract each differential signal at the input side when transmitting three differential signals with two pairs of signal lines.

To these ends, according to one aspect of the present invention, there is provided a differential signal receiving device for receiving a first differential signal, a second differential signal, and a third differential signal, including a first terminator connected between a first signal line pair for transmitting the first differential signal with one of the third differential signal as a common voltage, a second terminator connected between a second signal line pair for transmitting the second differential signal with another one of the third differential signal as a common voltage, and a voltage adjuster for equalizing voltages at a first intermediate node of the first terminator and a second intermediate node of the second terminator. This device can reduce the reflection of the third differential signal.

In the above differential signal receiving device, the first intermediate node may be a center node of the first terminator and the second intermediate node may be a center node of the second terminator. The voltage adjuster may connect the first intermediate node and the second intermediate node. The voltage adjuster may have a part for connecting the first intermediate node to a ground and a part for connecting the second intermediate node to the ground. Alternatively, the voltage adjuster may have a part for connecting the first intermediate node to a fixed voltage and a part for connecting the second intermediate node to the fixed voltage.

The differential signal receiving device may further include an extraction circuit for extracting a differential signal corresponding to the third differential signal based on a voltage at the first terminator and a voltage at the second terminator. The extraction circuit may include a first differential signal extraction circuit connected to the first signal line pair and a second differential signal extraction circuit connected to the second signal line pair, the first differential signal extraction circuit may have a first differential pair for receiving a differential signal transmitted through the first signal line pair and outputting a tail voltage and a differential signal, and the second differential signal extraction circuit may have a second differential pair for receiving a differential signal transmitted through the second signal line pair and outputting a tail voltage and a differential signal. The differential signal receiving device may further has a third differential pair for receiving a voltage of the first differential pair and a tail voltage of the second differential pair as a differential input and outputting a differential signal corresponding to the differential input.

According to another aspect of the present invention, there is provided a differential signal transmission system including a differential signal receiving device according to claim 1, and a differential signal transmission device having a first transmission circuit for transmitting the first differential signal with one of the third differential signal as a common voltage through a signal line pair to which the first terminator is connected and a second transmission circuit for transmitting the second differential signal with another one of the third differential signal as a common voltage through a second signal line pair to which the second terminator is connected.

According to yet another aspect of the present invention, there is provided a differential signal receiving device for receiving a first differential signal transmitted through a first signal line pair, a second differential signal transmitted through a second signal line pair, and a third differential signal transmitted as a common voltage of the first and second signal line pairs, including a first differential pair for receiving a differential signal transmitted through the first signal line pair and outputting a tail voltage and a differential signal corresponding to the first differential signal, and a second differential pair for receiving a differential signal transmitted through the second signal line pair and outputting a tail voltage and a differential signal corresponding to the second differential signal, and a third differential pair for receiving a tail voltage of the first differential pair and a tail voltage of the second differential pair as a differential input and outputting a differential signal corresponding to a third differential signal. This device can effectively extract each differential signal at the input side when transmitting three differential signals with two pairs of signal lines.

The above differential signal receiving device may further includes a first differential amplification circuit for receiving a differential signal from the first differential pair; and a second differential amplification circuit for receiving a differential signal from the second differential pair.

According to another aspect of the present invention, there is provided a differential signal transmission system including a differential signal receiving device according to claim 10, and a differential signal transmission device having a first transmission circuit for transmitting the first differential signal with one of the third differential signal as a common voltage through a signal line pair to which the first terminator is connected and a second transmission circuit for transmitting the second differential signal with another one of the third differential signal as a common voltage through a second signal line pair to which a first terminator is connected.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

A specific embodiment of the present invention will be explained hereinafter with reference to the drawings.

Figure 1:
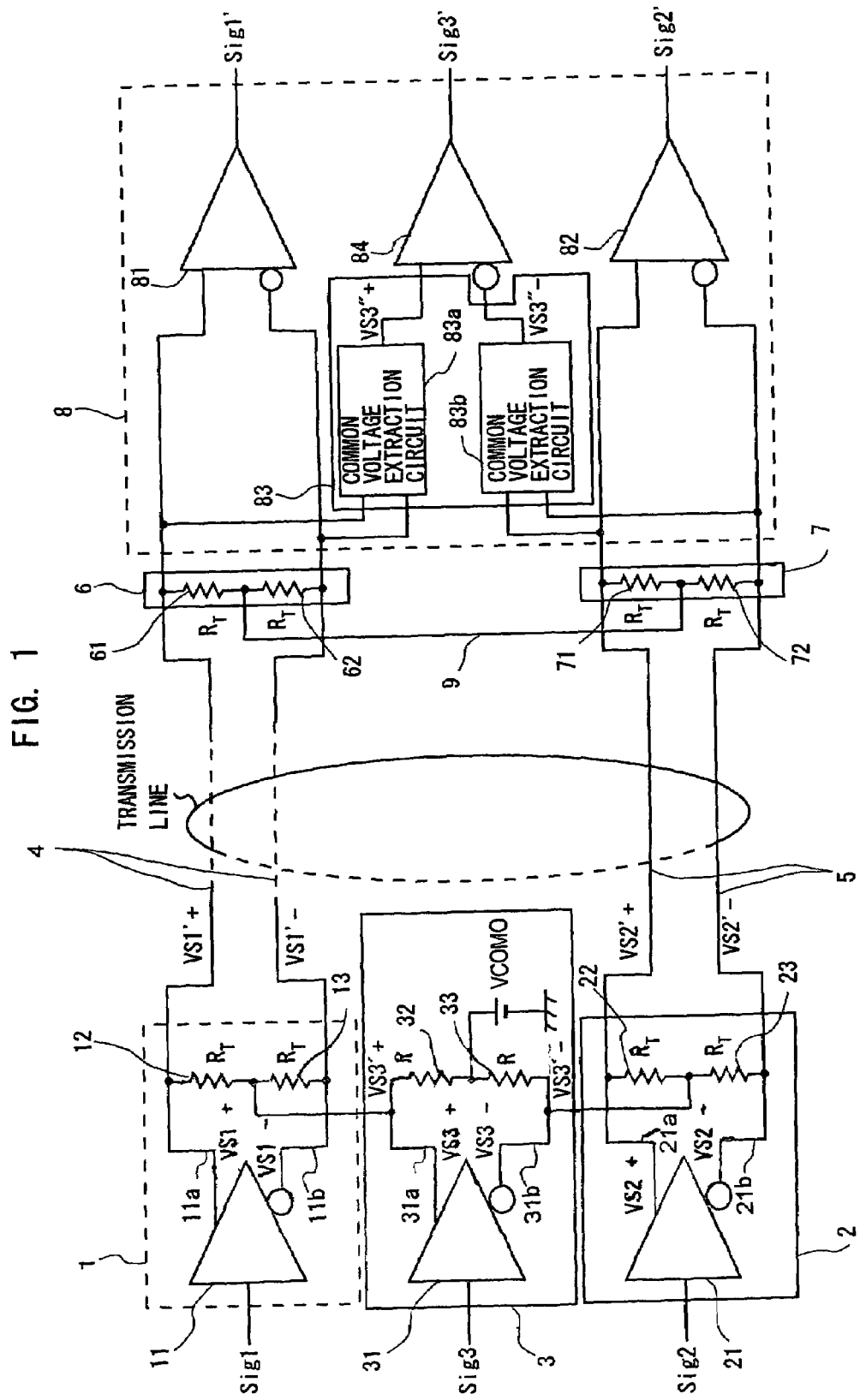
FIG. 1 is a circuit diagram illustrating a differential signal transmission system according to a specific embodiment of the invention.

Referring first to FIG. 1, a block circuit diagram of a differential signal transmission system according to a specific embodiment of the invention is shown.

The differential signal transmission system shown in FIG. 1 includes a first output buffer 1, a second output buffer 2, a third output buffer 3, a signal line pair 4, a signal line pair 5, a first terminator 6, a second terminator 7, and an input buffer 8.

The first output buffer 1, which is an example of a first transmission circuit, includes a differential signal output circuit 11 and resistors 12 and 13.

The differential signal output circuit 11 outputs a first differential signal (VS1+ and VS1−) corresponding to an input signal Sig1 to the pair of signal lines 4 through a pair of output lines 11a and 11b of the differential signal output circuit 11. Specifically, the differential signal output circuit 11 outputs a first differential signal (VS1+ and VS1−) of which a differential voltage corresponds to the input signal Sig1.

The resistors 12 and 13 connected in series are connected between the output lines 11a and 11b. Preferably, the impedances of the resistors 12 and 13 respectively match the impedances of two lines of the signal line pair 4.

The second output buffer 2, which is an example of a second transmission circuit, includes a differential signal output circuit 21 and resistors 22 and 23.

The differential signal output circuit 21 outputs a second differential signal (VS2+ and VS2−) corresponding to an input signal Sig2 to the pair of signal lines 5 through a pair of output lines 21a and 21b of the differential signal output circuit 21. Specifically, the differential signal output circuit 21 outputs a second differential signal (VS2+ and VS2−) of which a differential voltage corresponds the input signal Sig2.

The resistors 22 and 23 connected in series are connected between the output lines 21a and 21b. Preferably, the impedances of the resistors 22 and 23 respectively match the impedances of two lines of the signal line pair 5.

The third output buffer 3 includes a differential signal output circuit 31 and resistors 32 and 33.

The differential signal output circuit 31 outputs a third differential signal (VS3+ and VS3−) corresponding to an input signal Sig3 to a pair of output lines 31a and 31b of the differential signal output circuit 31. Specifically, the differential signal output circuit 31 outputs a third differential signal (VS3+ and VS3−) of which a differential voltage corresponds to the input signal Sig3.

The resistors 32 and 33 connected in series are connected between the output lines 31a and 31b. A common voltage VCOMO is applied to a connection node of the resistors 32 and 33. Thus, the third output buffer outputs the third differential signal (VS3′+ and VS3′−) whose common voltage is VCOMO.

The output line 31a for outputting one side (VS3′+) of the third differential signal is connected to a connection node of the resistors 12 and 13. The first output buffer 1 therefore outputs the first differential signal (VS1'+ and VS1'−) whose common voltage is one side (VS3'+) of the third differential signal to the signal line pair 4.

The output line 31b for outputting the other side (VS3'−) of the third differential signal is connected to a connection node of the resistors 22 and 23. The second output buffer 2 therefore outputs the second differential signal (VS2'+ and VS2'−) whose common voltage is the other side (VS3'−) of the third differential signal to the signal line pair 5.

The first, second, and third differential signals are synchronous.

The first terminator 6 is a series circuit of resistors 61 and 62 connected between the signal line pair 4. Preferably, the impedances of the resistors 61 and 62 respectively match the impedances of two lines of the signal line pair 4. Though the resistors 61 and 62 have the same resistance in this example, they may have different resistances depending on the design.

The second terminator 7 is a series circuit of resistors 71 and 72 connected between the signal line pair 5. Preferably, the impedances of the resistors 71 and 72 respectively match the impedances of two lines of the signal line pair 5. Though the resistors 71 and 72 have the same resistance in this example, they may have different resistances depending on the design.

The input buffer 8 includes a differential input buffer 81, a differential input buffer 82, a differential signal extraction circuit 83, and a differential input buffer 84. The differential signal extraction circuit 83 includes common voltage extraction circuits 83a and 83b.

The differential input buffer 81 generates an output corresponding to the voltage at the first terminator 6. Since the output from the first output buffer 1 is applied to the first terminator 6, the differential input buffer 81 outputs an output signal Sig1' corresponding to the input signal Sig1 input to the first output buffer 1.

The differential input buffer 82 generates an output corresponding to the voltage at the second terminator 7. Since the output from the second output buffer 2 is applied to the second terminator 7, the differential input buffer 82 outputs an output signal Sig2' corresponding to the input signal Sig2 input to the second output buffer 2.

The differential signal extraction circuit 83 extracts a differential signal corresponding to the third differential signal output from the third output buffer 3 according to the voltage at the first terminator 6 and the voltage at the second terminator 7.

Specifically, the common voltage extraction circuit 83a outputs a first voltage output (VS3"+) corresponding to the common voltage (VS3'+) of the first differential signal. The common voltage extraction circuit 83b outputs a second voltage output (VS3"−) corresponding to the common voltage (VS3'−) of the second differential signal.

The common voltage of the first differential signal is one side of the third differential signal and the common voltage of the second differential signal is the other side of the third differential signal. Thus, the first voltage output (VS3"+) output from the common voltage extraction circuit 83a and the second voltage output (VS3"−) output from the common voltage extraction circuit 83b are a differential signal pair corresponding to the third differential signal (VS3+ and VS3− or VS3'+ and VS3'−).

The differential input buffer 84 generates an output corresponding to a voltage difference in the differential signal corresponding to the third differential signal extracted by the differential signal extraction circuit 83. Thus, the differential input buffer 84 outputs an output signal Sig3' corresponding to the input signal Sig3 input to the third output buffer 3.

An intermediate node connection 9, which is an example of a voltage adjuster, connects a connection node of the resistors 61 and 62 (an intermediate node of the first terminator 6) and a connection node of the resistors 71 and 72 (an intermediate node of the second terminator 7). Since the resistors 61 and 62, and the resistors 71 and 72 respectively have the same resistance in this example, center nodes of the terminators are connected. The intermediate node connection 9 equalizes the voltages at the center node of the first terminator 6 and the center node of the second terminator 7.

Since the intermediate node of the first terminator 6 and the intermediate node of the second terminator 7 are connected by the intermediate node connection 9, the intermediate nodes of the first terminator 6 and the second terminator 7 act as a virtual ground of the third differential signal. This allows the matching of the impedance of the terminators related to the third differential signal and the impedance of the signal lines related to the third differential signal. It is thus able to prevent the reflection of the third differential signal.

Figure 2:
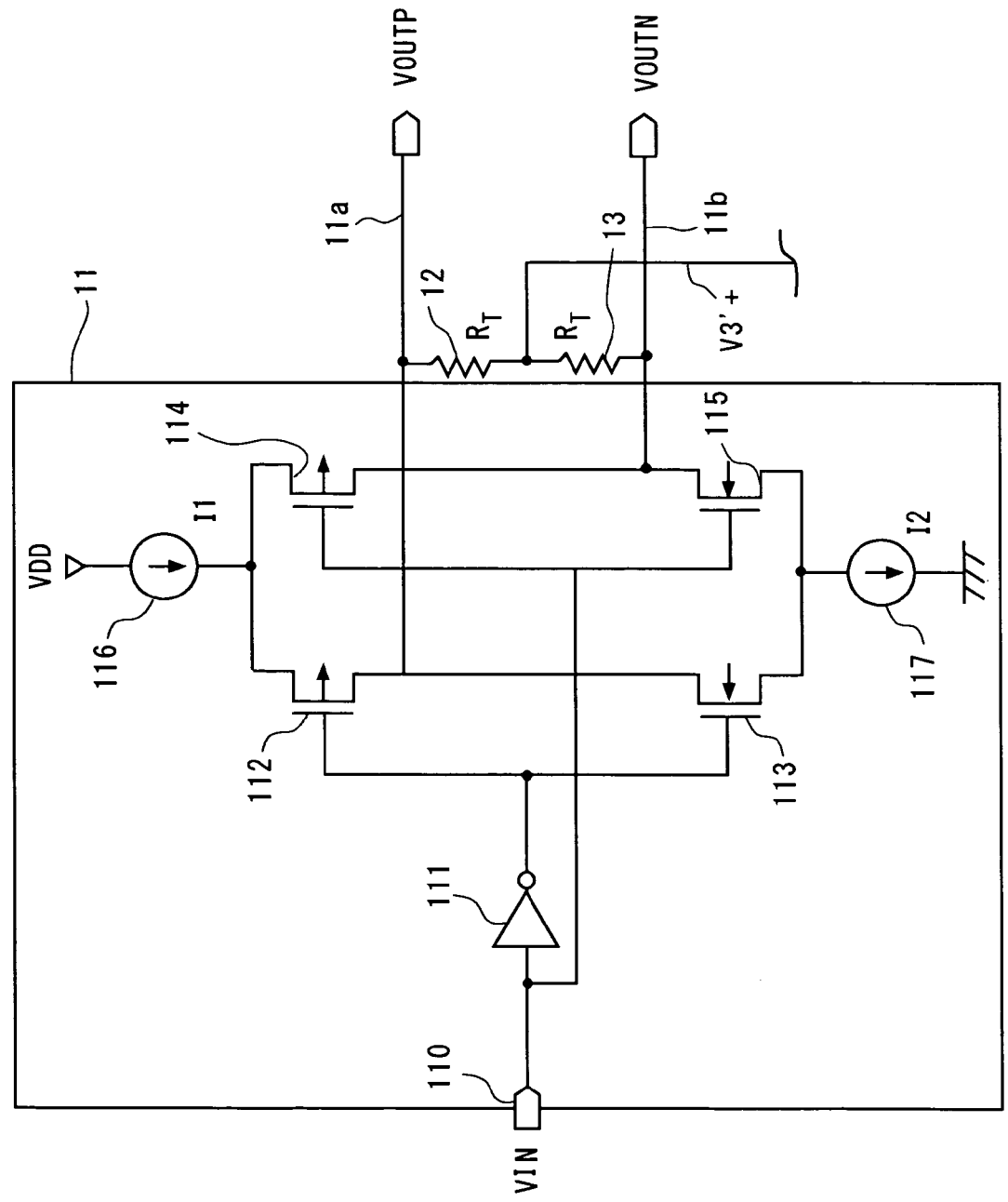
FIG. 2 is a circuit diagram illustrating an example of an output buffer illustrated in FIG. 1.

Referring next to FIG. 2, a circuit diagram of an example of the output buffer 1 is shown. In FIG. 2, the same elements as in FIG. 1 are denoted by the same reference symbols.

The output buffer 1 illustrated in FIG. 2 includes the differential signal output circuit 11 and the resistors 12 and 13. The differential signal output circuit 11 includes an input terminal 110, an inverter 111, a P-channel MOS transistor 112, a N-channel MOS transistor 113, a P-channel MOS transistor 114, a N-channel MOS transistor 115, a constant current circuit 116, and a constant current circuit 117.

In the output buffer 1 shown in FIG. 2, the impedances of the constant current circuits 116 and 117 are much higher than the impedances of the resistors 12 and 13. Thus, the output impedance of the output buffer 1 is defined by the resistors 12 and 13.

An input signal Sig1 is input to the input terminal 110. One side (VS3'+) of the third differential signal is input as a common voltage to the connection node of the resisters 12 and 13.

The differential signal output circuit 11 of the output buffer 1 shown in FIG. 2 is applicable to the differential signal output circuit 21 of the output buffer 2 and the differential signal output circuit 31 of the output buffer 3.

When using the differential signal output circuit 11 shown in FIG. 2 as the differential signal output circuit 21 of the output buffer 2, an input signal Sig2 is input to the input terminal 110 and the other side (VS3'−) of the third differential signal is input as a common voltage to the connection node of the resisters 22 and 23.

When using the differential signal output circuit 11 shown in FIG. 2 as the differential signal output circuit 31 of the output buffer 3, an input signal Sig3 is input to the input terminal 110 and a given common voltage VCOMO is input to the connection node of the resisters 32 and 33.

The operation will now be explained.

Figure 3:
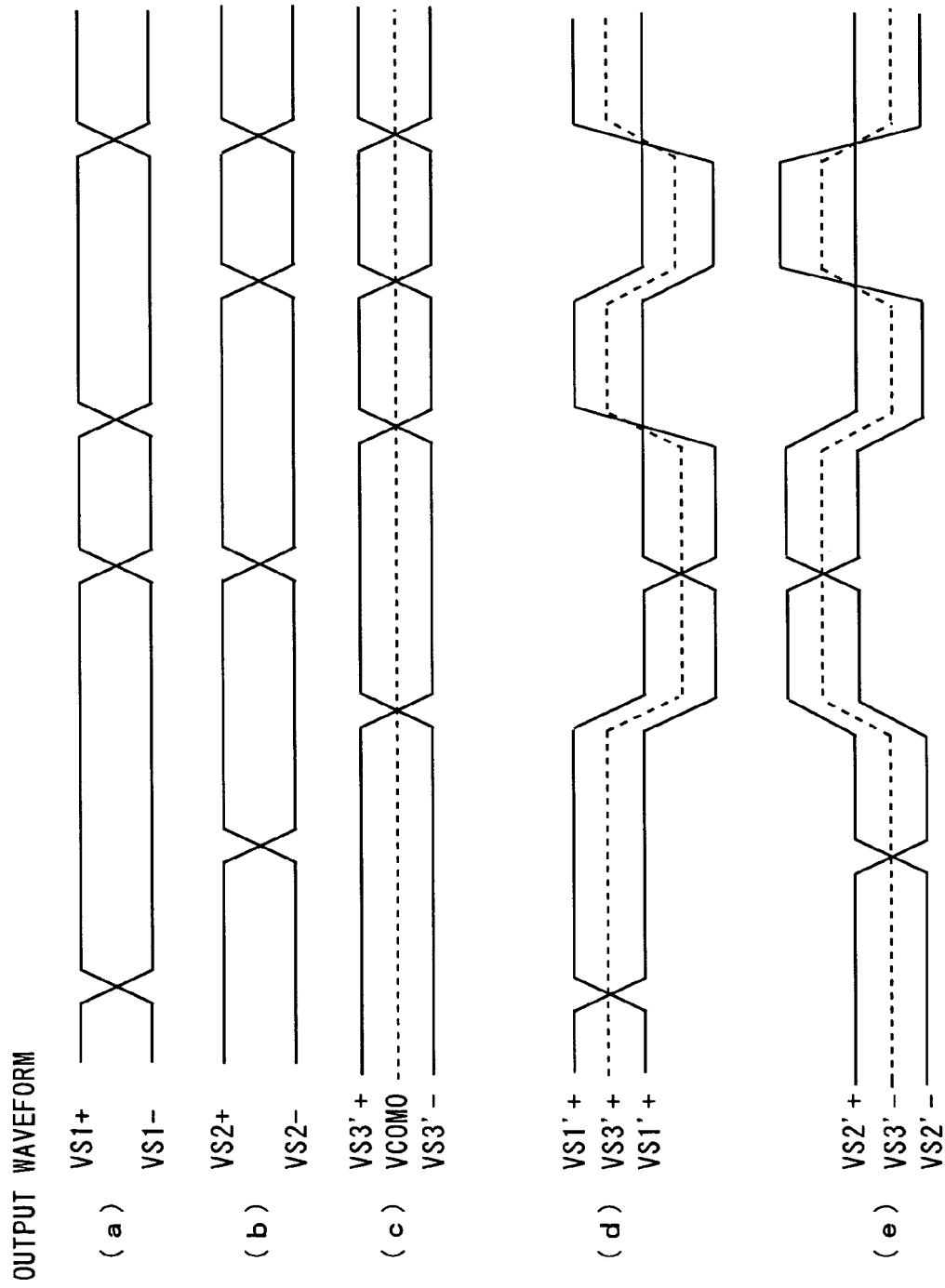
FIG. 3 shows waveforms to explain the operation of the differential signal transmission system illustrated in FIG. 1.

FIG. 3 shows waveforms to explain the voltage output (a) from the differential signal output circuit 11, the voltage output (b) from the differential signal output circuit 21, the voltage output (c) from the output buffer 3, the voltage (d) on the signal line pair 4, and the voltage (e) on the signal line pair 5.

Specifically, in FIG. 3, the waveform (a) shows an example of the first differential signal (VS1+ and VS1−) output from the differential signal output circuit 11 and the waveform (b) shows an example of the second differential signal (VS2+ and VS2−) output from the differential signal output circuit 21. The waveform (c) shows an example of the third differential signal (VS3'+ and VS3'−) output from the output buffer 3. The waveform (d) is the voltage waveform of the signal line pair 4, and the waveform (e) is the voltage waveform of the signal line pair 5.

Since the intermediate node of the first terminator 6 and the intermediate node of the second terminator 7 are connected by the intermediate node connection 9, the intermediate nodes of the first terminator 6 and the second terminator 7 act as a virtual ground of the third differential signal. This allows the matching of the impedance of the terminators related to the third differential signal and the impedance of the signal lines related to the third differential signal. It is thus able to avoid the reflection of the third differential signal to prevent the degradation of the signals transmitted through the signal line pairs 4 and 5.

The differential input buffer 81 outputs the signal Sig1' corresponding to a voltage difference in the first differential signal input through the signal line pair 4. The differential input buffer 82 outputs the signal Sig2' corresponding to a voltage difference in the second differential signal input through the signal line pair 5. The differential input buffer 84 outputs the signal Sig3' corresponding to a voltage difference in the differential signal output from the differential signal extraction circuit 83.

According to this embodiment, since the intermediate node of the first terminator 6 and the intermediate node of the second terminator 7 are connected by the intermediate node connection 9, it is able to prevent the reflection of the differential signal at the end of the signal line when transmitting three differential signals using four signal lines, thereby ensuring the accurate transmission of three differential signals through four signal lines.

Hence, when the differential signal extraction circuit 83 extracts a differential signal corresponding to the third differential signal according to the voltages at the first terminator 6 and the second terminator 7, it is able to extract the differential signal corresponding to the third differential signal with high accuracy.

Since this embodiment uses a differential signal as a common voltages of the signal lines 4 and 5 for transmitting differential signals, average voltages on the four signal lines are substantially equal, thereby preventing EMI.

Since external noise common to the four signal lines is common mode noise to the differential input buffers 81, 82, and 84, the noise does not affect the signals output from the differential input buffers 81, 82, and 84.

Figure 4:
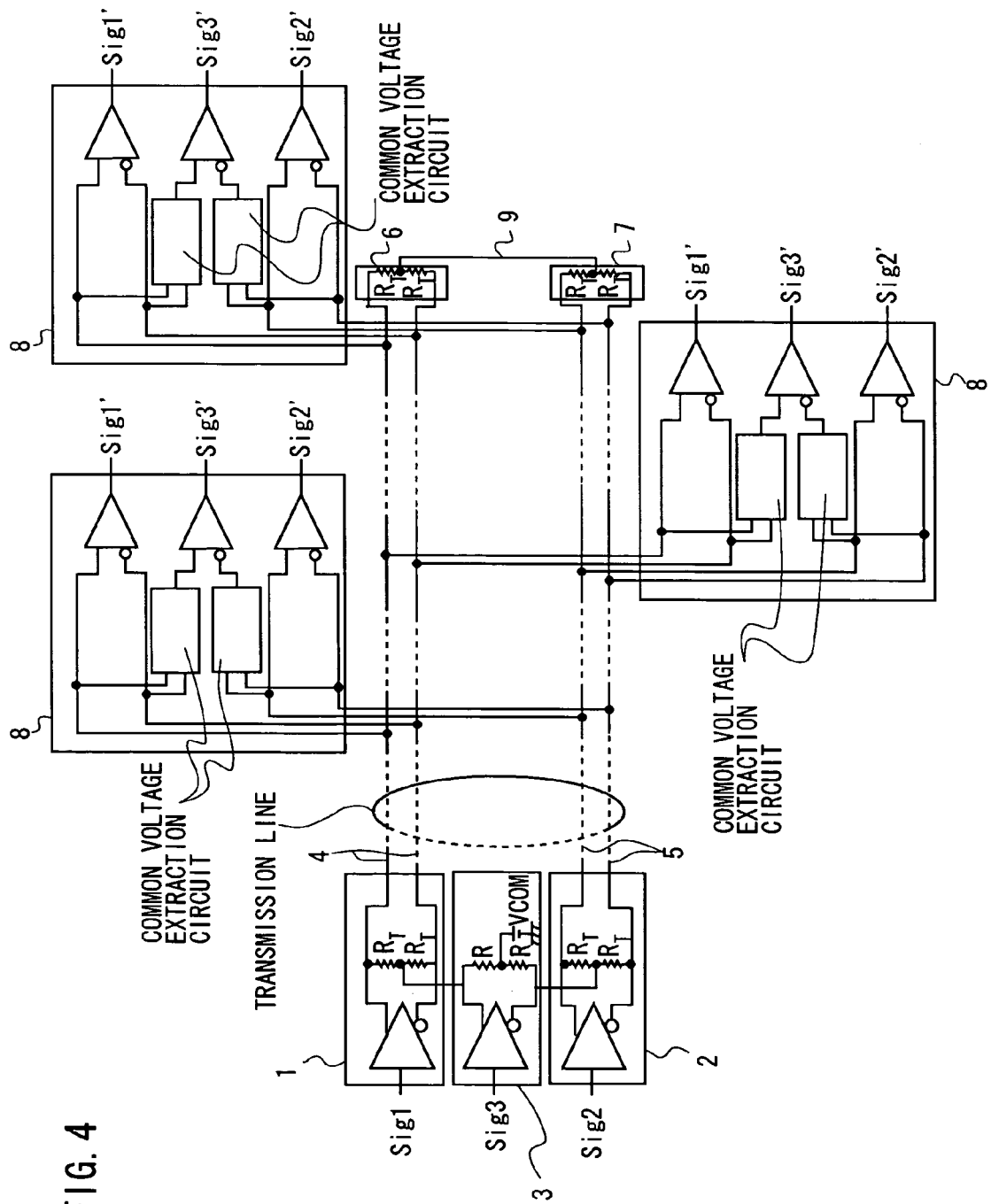
FIG. 4 is a circuit diagram illustrating a differential signal transmission system according to another specific embodiment of the invention.

If the input terminals of the common voltage extraction circuits 83a and 83b have only small effects on the signal lines 4 and 5, the system may be a multidrop configuration in which a plurality of input buffers 8 are provided for the signal lines 4 and 5, FIG. 4 shows an example of the multidrop configuration in which three input buffers 8 are provided as the plurality of input buffer 8. In FIG. 4, the same elements as in FIG. 1 are denoted by the same reference symbols. As shown in FIG. 4, each input buffer 8 is connected to the signal lines 4 and 5 in the same manner. Each input buffer 8 extracts and amplifies the first, second, and third differential signals transmitted through the signal lines 4 and 5 and outputs the signals toward an internal circuit. The terminators 6 and 7 are connected to the ends of the signal lines 4 and 5, respectively, for the impedance matching of the differential signals. This multidrop configuration allows the transmission of a differential signal to a plurality of input buffers 8 with a limited number of signal lines.

Figure 5:
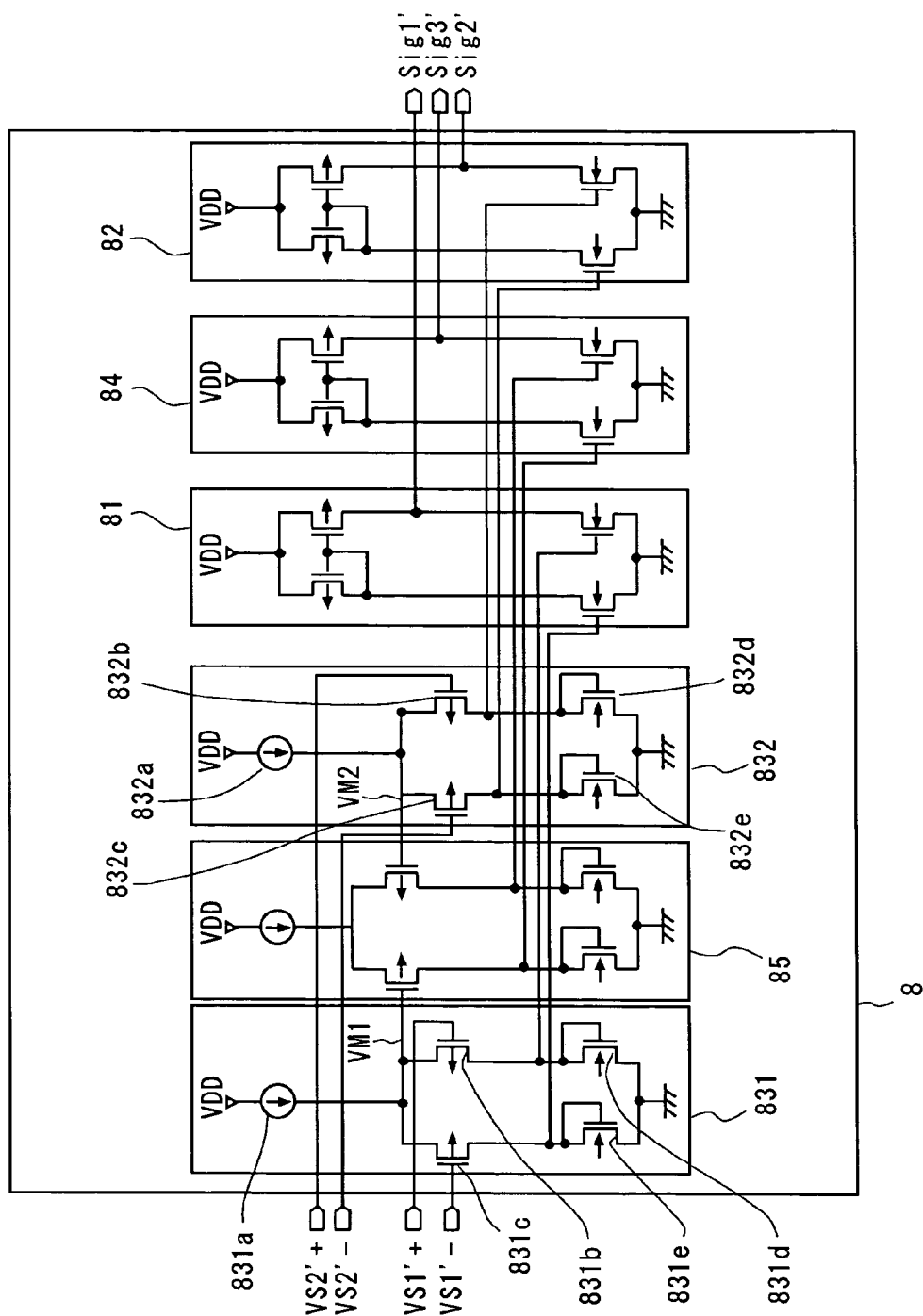
FIG. 5 is a circuit diagram illustrating an example of an input buffer illustrated in FIGS. 1 and 4.

FIG. 5 shows another example of the input buffer 8. In FIG. 5, the same elements as in FIG. 1 are denoted by the same reference symbols.

The input buffer 8 illustrated in FIG. 5 includes a first differential signal extraction circuit 831, a second differential signal extraction circuit 832, a signal level adjustment circuit 85, and the differential input buffers 81, 82, and 84.

The first differential signal extraction circuit 831 outputs a first output VM1 corresponding to the lower one of the voltages at the both ends of the first terminator 6.

The first differential signal extraction circuit 831 includes a constant current circuit 831a, a first P-channel MOS transistor 831b, a second P-channel MOS transistor 831c, a first N-channel MOS transistor 831d, and a second N-channel MOS transistor 831e. The first P-channel MOS transistor 831b and the second P-channel MOS transistor 831c constitute a differential pair. The constant current circuit 831a connected to a high-voltage power supply (VDD) is connected to the differential pair tail. The inputs of the differential pair receive the differential signal transmitted through the signal line pair 4.

Specifically, the gate of the first P-channel MOS transistor 831b receives one (VS1'+) of the voltages at the both ends of the first terminator 6, and the source of the same is connected to the other end of the constant current circuit 831a.

On the other hand, the gate of the second P-channel MOS transistor 831c receives the other one (VS1'−) of the voltages at the both ends of the first terminator 6, and the source of the same is connected to the end of the constant current circuit 831a.

The diode-connected first and second N-channel MOS transistor 831d and 831e are connected to the output side (load side) of the differential pair composed of the first and second P-channel MOS transistors 831b and 831c, respectively. The drain and gate of the first N-channel MOS transistor 831d are connected to the drain of the first P-channel MOS transistor 831b, and the source of the same is connected to the low voltage side of the power supply (ground).

The drain and gate of the second N-channel MOS transistor 831e are connected to the drain of the second P-channel MOS transistor 831c, and the source of the same is connected to the low voltage side of the power supply (ground).

The first differential signal extraction circuit 831 outputs a tail voltage at (a voltage at the source of) the differential pair composed of the first and second P-channel MOS transistors 831b and 831c as the first output (VM1 1). In other words, the first differential signal extraction circuit 831 outputs a voltage at the connection node of the end of the constant current circuit 831a and the sources of the first and second P-channel MOS transistors 831b and 831c as the first output (VM1).

The first and second P-channel MOS transistor 831b and 831c act as a switch according to inputs. Thus, the transistor receiving the higher voltage side of the input differential signal (VS1'+ and VS1'−) turns OFF and the transistor receiving the lower voltage side of the same signal turns ON. The tail voltage (VM1) of the differential pair therefore changes according to the lower voltage side of the input differential signal (VS1'+ and VS1').

The differential output signal from the differential pair of the first differential signal extraction circuit 831 is input to the differential input buffer 81. Thus, a voltage at the intermediate node between the drains of the first P-channel MOS transistor 831b and the first N-channel MOS transistor 831*d* is output as one side of the differential output. A voltage at the intermediate node between the drains of the second P-channel MOS transistor 831*c* and the second N-channel MOS transistor 831*e* is output as the other side of the differential output. Hence, an differential output corresponding to the voltage of the input differential signal (VS1'+and VS1'−) is input to the differential input buffer 81. The level of the differential signal (VS1'+ and VS1'−) transmitted through the signal line pair 4 is thereby adjusted.

The second differential signal extraction circuit 832 outputs the second output (VM2) corresponding to the lower one of the voltages at the both ends of the second terminator 7.

The second differential signal extraction circuit 832 includes a constant current circuit 832*a*, a third P-channel MOS transistor 832*b*, a fourth P-channel MOS transistor 832*c*, a third N-channel MOS transistor 832*d*, and a fourth N-channel MOS transistor 832*e*. The third P-channel MOS transistor 832*b* and the fourth P-channel MOS transistor 832*c* constitute a differential pair. The constant current circuit 832*a* connected to a high-voltage power supply (VDD) is connected to the differential pair tail. The inputs of the differential pair receive the differential signal transmitted through the signal line pair 5.

Specifically, the gate of the third P-channel MOS transistor 832*b* receives one (VS2'+) of the voltages at the both ends of the second terminator 7, and the source of the same is connected to the other end of the constant current circuit 832*a*.

On the other hand, the gate of the fourth P-channel MOS transistor 832*c* receives the other one (VS2'−) of the voltages at the both ends of the second terminator 7, and the source of the same is connected to the end of the constant current circuit 832*a*.

The diode-connected third and fourth N-channel MOS transistor 832*d* and 832*e* are connected to the output side (load side) of the differential pair composed of the third and fourth P-channel MOS transistors 832*b* and 832*c*, respectively. The drain and gate of the third N-channel MOS transistor 832*d* are connected to the drain of the third P-channel MOS transistor 832*b*, and the source of the same is connected to the low voltage side of the power supply (ground).

The drain and gate of the fourth N-channel MOS transistor 832*e* are connected to the drain of the fourth P-channel MOS transistor 832*c*, and the source of the same is connected to the low voltage side of the power supply (ground).

The second differential signal extraction circuit 832 outputs a tail voltage at (a voltage at the source of) the differential pair composed of the third and fourth P-channel MOS transistors 832*b* and 832*c* as the second output (VM2). In other words, the second differential signal extraction circuit 832 outputs a voltage at the connection node of the end of the constant current circuit 832*a* and the sources of the third and fourth P-channel MOS transistors 832*b* and 832*c* as the second output (VM2).

The third and fourth P-channel MOS transistors 832*b* and 832*c* act as a switch according to inputs. Thus, the transistor receiving the higher voltage side of the input differential signal (VS2'+ and VS2'−) turns OFF and the transistor receiving the lower voltage side of the same signal turns ON. The tail voltage (VM2) of the differential pair therefore changes according to the lower voltage side of the input differential signal (VS2'+ and VS2').

The differential output signal from the differential pair of the second differential signal extraction circuit 832 is input to the differential input buffer 82. Thus, a voltage at the intermediate node between the drains of the third P-channel MOS transistor 832*b* and the third N-channel MOS transistor 832*d* is output as one side of the differential output. A voltage at the intermediate node between the drains of the fourth P-channel MOS transistor 832*c* and the fourth N-channel MOS transistor 832*e* is output as the other side of the differential output. Hence, an differential output corresponding to the voltage of the input differential signal (VS2'+and VS2'−) is input to the differential input buffer 82. The level of the differential signal (VS2'+ and VS2'−) transmitted through the signal line pair 5 is thereby adjusted.

The signal level adjustment circuit 85 has the same circuit configuration as the first differential signal extraction circuit 831 and the second differential signal extraction circuit 832. The first output (VM1) from the first differential signal extraction circuit 831 and the second output (VM2) from the second differential signal extraction circuit 832 are input to the signal level adjustment circuit 85 as a differential input signal. The signal level adjustment circuit 85 outputs a differential signal corresponding to the differential voltage of the first output (VM1) and the second output (VM2). Thus, the signal level adjustment circuit 85 can adjust the first output (VM1) and the second output (VM2) to the level appropriate for input to the differential input buffer 84.

The differential input buffers 81, 82, and 84 are differential amplification circuits.

The input buffer 8 shown in FIG. 5 focuses on the voltage change in the sources of the differential pairs. The voltage VM1 follows the lower one of the VS1'+ and VS1'−, and the voltage VM2 follows the lower one of VS2'+ and VS2'−.

Thus, the voltages VM1 and VM2 change in substantially the same way as VS3'+ and VS3'−, and it is able to extract the signal Sig3' through the differential input buffer 84 that detects the difference of the two signals corresponding to VM1 and VM2.

However, since a switching edge of signals is uncertain in the voltages VM1 and VM2, it is preferred that the signal requiring a signal edge is not assigned to Sig3.

This embodiment uses the first output VM1 generated from the first differential signal and the second output VM2 generated from the second differential signal. It is thus able to extract a differential signal corresponding to the third differential signal with high voltage level compared to the case of extracting a differential signal corresponding to the third differential signal from the intermediate voltage of the first terminator 6 and the intermediate voltage of the second terminator 7. Further, since this embodiment generates a differential signal corresponding to the third differential signal using the first output VM1 extracted from the signal line 4 and the second output VM2 extracted from the signal line 5 as a differential input, it is able to accurately generate the output Sig3' corresponding to the third differential signal even when the common voltage of the third differential signal changes.

Furthermore, this embodiment extracts a differential signal corresponding to the third differential signal using the first and second differential signal extraction circuits 831 and 832 that extract a differential signal from transmission signals on the signal lines 4 and 5, respectively. It is thus able to prevent the differential signal extraction circuits from affecting the impedances of the first and second terminators.

For example, it is able to eliminate the need for impedance matching between the resistors and the signal lines occurring when extracting a differential signal corresponding to the third differential signal from the intermediate voltage at the resistors connected in parallel in the first terminator 6 and the intermediate voltage at the resistors connected in parallel in the second terminator 7.

In addition, the first and second differential signal extraction circuits 831 and 832 for extracting a differential signal corresponding to the third differential signal can adjust the levels of the first and second differential signals. This can simplify the configuration compared to the case of preparing both a circuit for extracting a differential signal corresponding to the third differential signal and a circuit for adjusting the levels of the first and second differential signals.

In the input buffer 8 shown in FIG. 5, the first and second differential signal extraction circuit 831 and 832 receive the differential signal with the P-channel MOS transistors; however, they may receive the signal with the N-channel MOS transistors. In this case, a differential signal corresponding to the third differential signal is extracted at the higher voltage side of the first and second differential signals.

The configurations explained in the embodiments described in the foregoing are given by way of example only, and the present invention is not limited thereto.

For example, the voltage adjuster is not restricted to the intermediate node connection 9.

Figure 6:
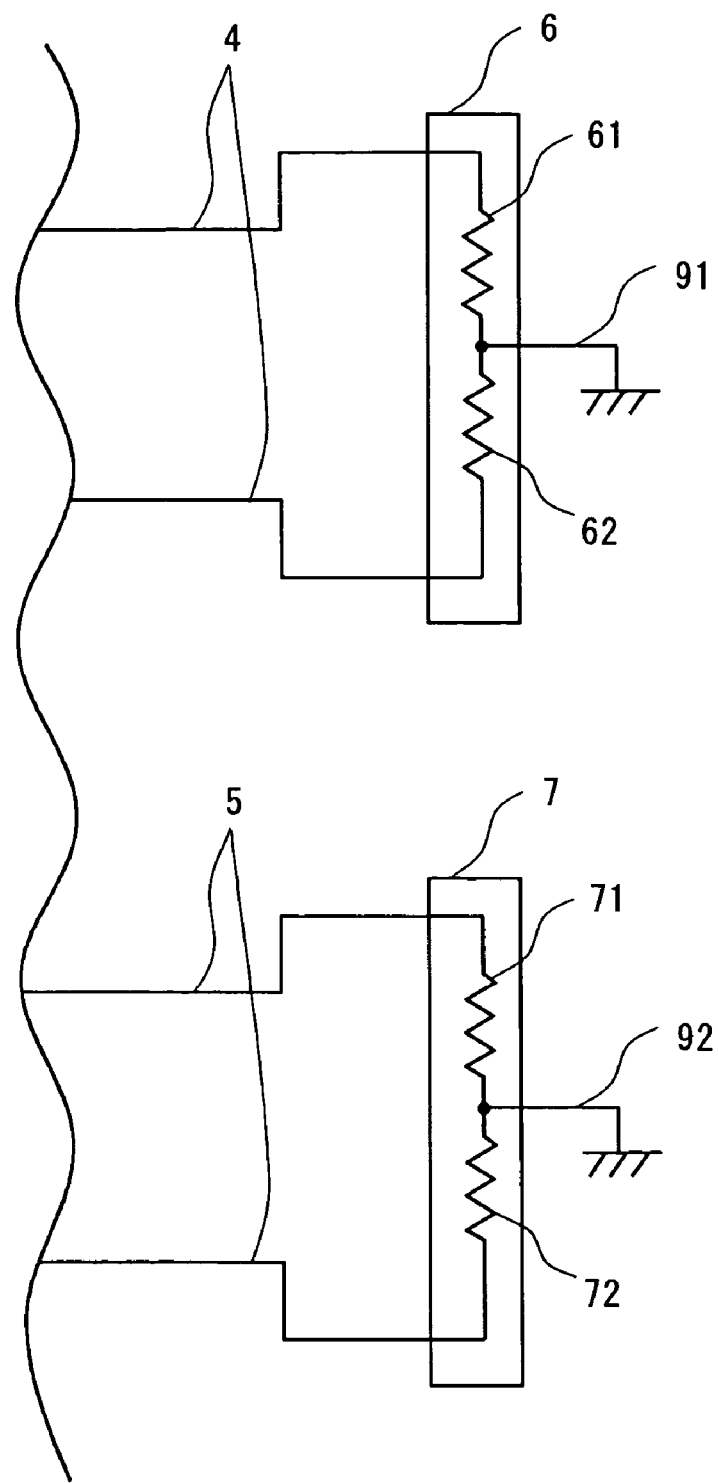
FIG. 6 is a circuit diagram illustrating another example of a voltage adjuster illustrated in FIG. 1.

FIG. 6 shows another example of the voltage adjuster. In FIG. 6, the same elements as in FIG. 1 are denoted by the same reference symbols.

As shown in FIG. 6, the voltage adjuster may be composed of a first ground part 91 for connecting the intermediate node of the first terminator 6 to the ground and a second ground part 92 for connecting the intermediate node of the second terminator 7 to the ground. The first ground part 91 and the second ground part 92 may connect the intermediate nodes of the first and second terminators 6 and 7 directly to the ground or may AC-connect them to the ground through capacitors.

Figure 7:
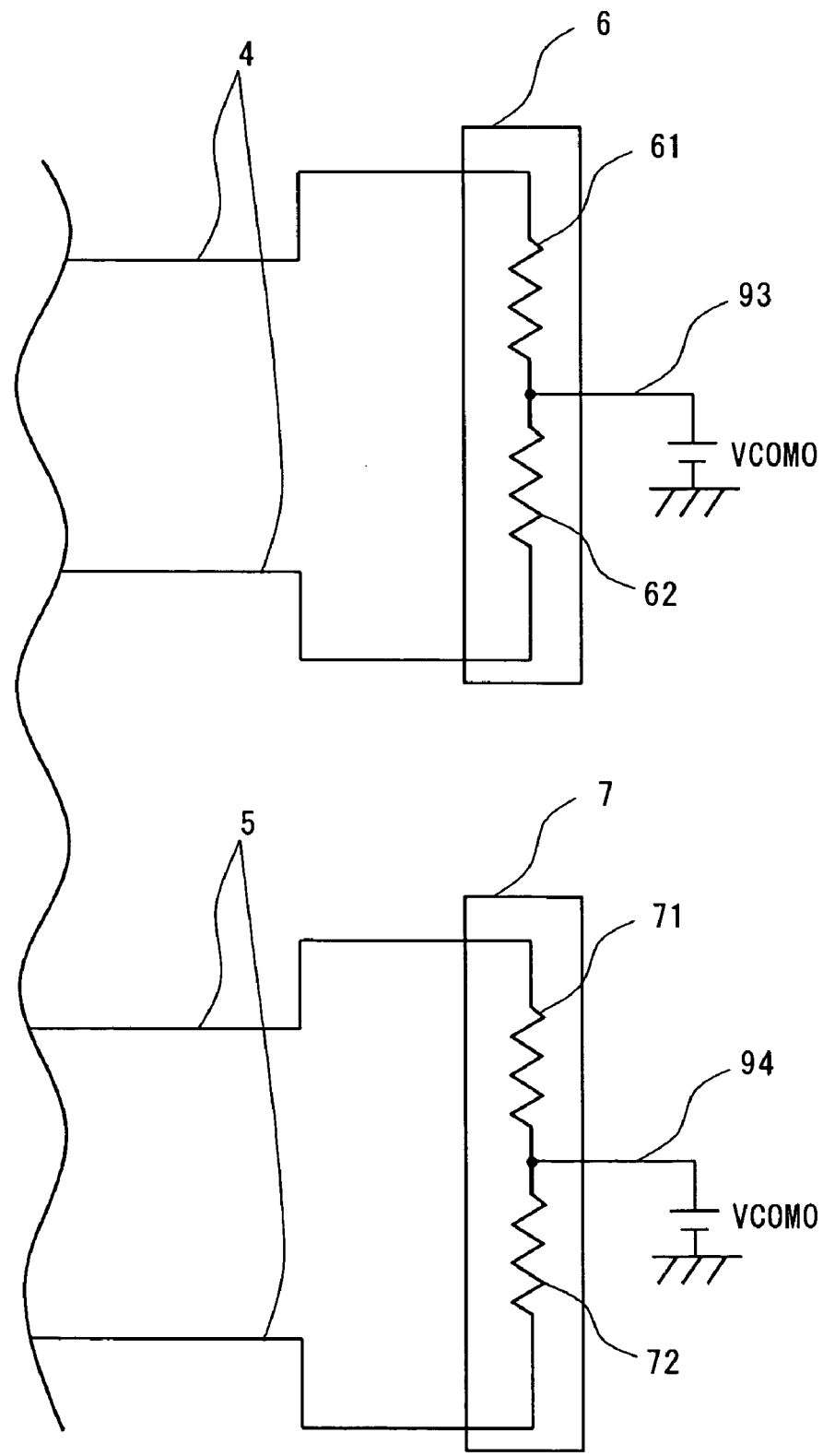
FIG. 7 is a circuit diagram illustrating yet another example of the voltage adjuster illustrated in FIG. 1.

FIG. 7 shows yet another example of the voltage adjuster. In FIG. 7, the same elements as in FIG. 1 are denoted by the same reference symbols.

As shown in FIG. 7, the voltage adjuster may be composed of a first connection part 93 for connecting the intermediate node of the first terminator 6 to a given voltage (for example, a common voltage VCOMO input to the differential signal output circuit 31) and a second connection part 94 for connecting the intermediate node of the second terminator 7 to the given voltage (for example, the common voltage VCOMO input to the differential signal output circuit 31).

According to the present invention, the first terminator is connected between a pair of signal lines transmitting the first differential signal with one side of the third differential signal as a common voltage and the second terminator is connected between a pair of signal lines transmitting the second differential signal with the other side of the third differential signal as a common voltage. The voltage adjuster equalizes the intermediate node of the first terminator and the intermediate node of the second terminator.

Thus, the intermediate node of the first terminator and the intermediate node of the second terminator act as a virtual ground of the third differential signal, enabling the impedance matching of the terminators and the signal lines on the third differential signal. This allows preventing the reflection of the third differential signal.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A differential signal transmission system for transmitting a first differential signal, a second differential signal, and a third differential signal, said differential signal transmission system comprising:
    a first transmission circuit comprising a first differential signal output circuit, having a first single input and a first pair of output lines, and a first pair of resistors serially connected across the first pair of output lines, said first differential signal output circuit receiving a first input signal and outputting to the first pair of output lines said first differential signal corresponding to the first input signal;
    a second transmission circuit comprising a second differential signal output circuit, having a second single input and a second pair of output lines, and a second pair of resistors serially connected across the second pair of output lines, said second differential signal output circuit receiving a second input signal and outputting to the second pair of output lines said second differential signal corresponding to the second input signal;
    a third transmission circuit comprising a third differential signal output circuit, having a third single input and a third pair of output lines, and a third pair of resistors serially connected across the third pair of output lines, said third differential signal output circuit receiving a third input signal and outputting to the third pair of output lines said third differential signal corresponding to the third input signal;
    a fixed voltage source connected to the junction of said serially connected third pair of resistors;
    a first connection part connecting a first one of the third pair of output lines to the junction of said serially connected first pair of resistors;
    a second connection part connecting a second one of the third pair of output lines to the junction of said serially connected second pair of resistors;
    a first signal line pair connected to the first pair of output lines;
    a second signal line pair connected to the second pair of output lines;
    a first terminator connected across said first signal line pair for transmitting the first differential signal with one side of the third differential signal as a first common voltage;
    a second terminator connected across said second signal line pair for transmitting the second differential signal with another side of the third differential signal as a second common voltage; and
    a voltage adjuster for equalizing voltages at a first intermediate node of the first terminator and a second intermediate node of the second terminator.

2. A differential signal transmission system according to claim 1, wherein the first intermediate node is a center node of the first terminator and the second intermediate node is a center node of the second terminator.

3. A differential signal transmission system according to claim 2, wherein the voltage adjuster connects the first intermediate node and the second intermediate node.

4. A differential signal transmission system according to claim 2, wherein the voltage adjuster comprises a third connection part for connecting the first intermediate node to a ground and a fourth connection part for connecting the second intermediate node to the ground.

5. A differential signal transmission system according to claim 2, wherein the voltage adjuster comprises a third connection part for connecting the first intermediate node to said fixed voltage source and a fourth connection part for connecting the second intermediate node to said fixed voltage source.

6. A differential signal transmission system according to claim 1, further comprising:
an extraction circuit for extracting a differential signal corresponding to the third differential signal based on a voltage at the first terminator and a voltage at the second terminator.

7. A differential signal transmission system according to claim 6,
wherein the extraction circuit comprises a first differential signal extraction circuit connected to the first signal line pair and a second differential signal extraction circuit connected to the second signal line pair,
the first differential signal extraction circuit comprises a first differential transistor pair for receiving the first differential signal transmitted through the first signal line pair and outputting a tail voltage and a first extraction differential signal, and
the second differential signal extraction circuit comprises a second differential transistor pair for receiving the second differential signal transmitted through the second signal line pair and outputting a tail voltage and a second extraction differential signal.

8. A differential signal transmission system according to claim 7, wherein the extraction circuit further comprises a third differential transistor pair for receiving the tail voltage of the first differential transistor pair and the tail voltage of the second differential transistor pair as a differential input.

9. A differential signal transmission system according to claim 1, further comprising:
a first differential transistor pair for receiving the first differential signal transmitted through the first signal line pair and outputting a tail voltage and a differential signal corresponding to the first differential signal; and
a second differential transistor pair for receiving the second differential signal transmitted through the second signal line pair and outputting a tail voltage and a differential signal corresponding to the second differential signal; and
a third differential transistor pair for receiving the voltage of the first differential transistor pair and the tail voltage of the second differential transistor pair as a differential input and outputting a differential signal corresponding to the third differential signal.

10. A differential signal transmission system according to claim 9, further comprising:
a first differential amplification circuit for receiving the differential signal from the first differential transistor pair; and
a second differential amplification circuit for receiving the differential signal from the second differential transistor pair.

11. A differential signal receiving device for receiving a first differential signal, a second differential signal, and a third differential signal, said differential signal receiving device comprising:
a first terminator connected across a first signal line pair for transmitting the first differential signal with one side of the third differential signal as first common voltage;
a second terminator connected across a second signal line pair for transmitting the second differential signal with another side of the third differential signal as a second common voltage; and
a voltage adjuster for equalizing voltages at a first intermediate node of the first terminator and a second intermediate node of the second terminator, wherein:
the first intermediate node comprises a center node of the first terminator and the second intermediate node comprises a center node of the second terminator; and
the voltage adjuster comprises a first connection part for connecting the first intermediate node to a ground and a second connection part for connecting the second intermediate node to the ground.

12. A differential signal receiving device for receiving a first differential signal, a second differential signal, and a third differential signal, said differential signal receiving device comprising:
a first terminator connected across a first signal line pair for transmitting the first differential signal with one side of the third differential signal as a first common voltage;
a second terminator connected across a second signal line pair for transmitting the second differential signal with another side of the third differential signal as a second common voltage; and
a voltage adjuster for equalizing voltages at a first intermediate node of the first terminator and a second intermediate node of the second terminator, wherein:
the first intermediate node comprises a center node of the first terminator and the second intermediate node comprises a center node of the second terminator; and
the voltage adjuster comprises a first connection part for connecting the first intermediate node to a fixed voltage and a second connection part for connecting the second intermediate node to the fixed voltage.

* * * * *